United States Patent
Dorfman et al.

(10) Patent No.: US 7,987,071 B1
(45) Date of Patent: Jul. 26, 2011

(54) REMOTE PASSIVE DETECTION OF FAILED POWER LINES AND ESTIMATION OF POWER LINE CURRENT AND POWER FLOW

(75) Inventors: Yevgeniy Yakov Dorfman, Newton, MA (US); Ronald Bruce Coleman, Arlington, MA (US); John Joseph Phelan, Arnold, MD (US); Paul James Remington, Sudbury, MA (US); George Woods Shepard, Carlisle, MA (US)

(73) Assignee: Raytheon BBN Technologies, Corp., Cambridge, MA (US)

( * ) Notice: Subject to any disclaimer, the term of this patent is extended or adjusted under 35 U.S.C. 154(b) by 1029 days.

(21) Appl. No.: 11/830,333

(22) Filed: Jul. 30, 2007

(51) Int. Cl.
 *G06F 11/30* (2006.01)

(52) U.S. Cl. ....................................... 702/183

(58) Field of Classification Search .............. 702/57–60, 702/64, 69, 75, 141, 182, 183, 185, 189; 324/219, 244, 301, 331, 345
See application file for complete search history.

(56) References Cited

U.S. PATENT DOCUMENTS

2007/0078334 A1 * 4/2007 Scully et al. .................. 600/424
* cited by examiner

*Primary Examiner* — Mohamed Charioui
(74) *Attorney, Agent, or Firm* — Chapin IP Law, LLC (57) ABSTRACT

A method and apparatus of performing power line sensing is presented. The method and apparatus includes a three-axial vector magnetic sensor for detecting a magnetic field radiated from a power line. An active isolation system is used to determine the effects of noise and other magnetic fields on the three-axial vector magnetic sensor. Power line status information is then determined from data received from the three-axial vector magnetic sensor and the active isolation system.

29 Claims, 4 Drawing Sheets

REMOTE PASSIVE DETECTION OF FAILED POWER LINES AND ESTIMATION OF POWER LINE CURRENT AND POWER FLOW

GOVERNMENT RIGHTS

This invention was made with Government support under Contract No. Contract No. FA8650-06-C-7614, awarded by USAF/AFMC. The Government has certain rights in this invention.

BACKGROUND

One effect from the occurrence of accidents, storms, and natural disasters are incidences of failed power lines. Failed power lines result in a loss of power for businesses and residences.

For residences, having a failed power lines causes several hardships. The residence inhabitants can be without necessities such as heat, air conditioning, and water. The residence may also be without communications (phone, television, computer access and the like). Additionally, the inhabitants of the residence may not be able to prepare food, keep food refrigerated and the like.

For businesses, a similar set of hardships result from a failed power line. Besides the hardships mentioned above with respect to residences, a loss of power for a business could result in lost revenue opportunities since the employees of the business may be unable to perform job tasks. For example, a sales office may be unable to utilize their phone system to place calls to current or potential customers, a customer service organization may be unable to field calls from customers and the like.

Failed power lines can also result in a dangerous environment. In a situation where a "live" wire is down, the potential of the live wire being contacted by humans, animals and/or vehicles is great. This can lead to injury or even death. It is thus desirable to locate the occurrence and location of a failed power line as quickly and as safely as possible, such that appropriate corrective measures can be taken.

SUMMARY

Conventional mechanisms for determining an occurrence and location of failed power lines suffer from a variety of deficiencies. One such deficiency is that conventional techniques for detecting failed power lines (e.g., damage assessment after an occurrence of a natural disaster) rely on human observers from airborne platforms (such as a helicopter or small aircraft). However these techniques only work in the open terrain, and are generally insufficient for detecting failed power lines which are underground, failed power lines which are underwater or failed power lines obscured by foliage.

Particular embodiments of the presently disclosed system and method of remote passive detection of failed power lines and estimation of power line current and power flow provides a measurement system which may or may not include a human observer, suitable to deploy on any airborne platform (including unmanned aircraft); suitable to perform automated measurement, reporting and alerting; and capable to determine power status of conductors not visible optically, including power lines under foliage, underground and underwater (such as underground and underwater power cables).

The system provides enhanced capabilities that are based on injecting modulated low frequency current into the power lines in a convenient location (e.g., at substation). This modulation will be present in low frequency magnetic field (sensed from stand-off) and will allow status (e.g., current) in the power line of interest (or power line conductor of interest) to be assessed, even in the presence of interfering signals from other power lines (or conductors) in the same bundle of conductors.

Embodiments of the presently disclosed system rely on measurement of low frequency electromagnetic fields and on advanced signal processing methodologies in order to remotely measure current flow in power line conductors. This measurement can be used to find malfunctioning power lines (e.g., failed power lines characterized by very low current flow). This measurement also can be used to remotely characterize (and monitor) current (and power) flow in the power line. To determine the currents, the presently disclosed methods and systems rely on the use of one or more vector magnetic sensors that provide the most complete information about the detected magnetic field, necessary for precise characterization of currents in the power line.

Passive vibration isolation and active (in-wire) cancellation of sensor vibrations is used to reduce magnetic sensor noise (response to due to sensor motion) in Oorder to provide a high degree of characterization of the power line. Advanced methodologies (model based inversion, hypothesis testing) and ground truth when available (power line location, geometry of power line conductors, power line voltage) are used to infer power line current and power flow from measurements of magnetic field.

Embodiments of the invention are especially useful in an environment where there are many power lines in close proximity, or where status of an individual conductor (e.g., health of individual phase as opposed to the overall health of the three phase power line) is of interest. All power lines (and power line phases) operate at similar frequencies, and thus magnetic fields from individual lines are hard to isolate in places where multiple lines are present in close proximity. The presently disclosed methods and apparatus rely on similar supplemental injection of low frequency AC currents into power lines. This injection can take place in any location that is convenient (e.g., at large substations). Each individual current may be modulated in a unique way (e.g., have specific frequency, or unique sequence of frequencies, or have arbitrary amplitude, frequency or phase modulation specific to the current). The magnetic fields generated by these currents propagating along power line will have similar modulation unique to the conductor. The status of a specific conductor can be determined by focusing signal processing on signals having modulation unique to this conductor (e.g., absence of signature injected into conductor would indicate broken conductor).

In a particular embodiment, a power line sensor comprises a three-axial vector magnetic sensor capable of detecting a magnetic field radiated from a power line. The power line sensor further includes a passive vibration isolation system coupled to the vector magnetic sensor as well as an active isolation system. The sensor additionally includes a processor coupled to the three-axial vector magnetic sensor and the active isolation system, the processor capable of determining power line status information from data received from the three-axial vector magnetic sensor and the active isolation system.

It should be noted, that the term "active isolation" as used herein refers to the use of accelerometers and/or current sensors (for EMI noise sources) to subtract from the sensor 'signals' that portion which is correlated with the accelerometers and/or current sensors. This is distinctly different from physically reducing the forces transmitted to the magnetometers due to platform motion. What we are describing here is more generally known as 'in-wire cancellation' rather than traditional active isolation which implies the use of secondary excitation sources (e.g.; shakers) to physically minimize the force transmitted to the sensor (and therefore is motion due to platform noise sources).

In another particular embodiment, a method of performing power line sensing includes detecting a magnetic field radiated from a power line with a three-axial vector magnetic sensor. The method further includes utilizing an active isolation system to determine the effects of noise and other magnetic fields on the three-axial vector magnetic sensor. Additionally, the method further includes determining power line status information from data received from the three-axial vector magnetic sensor and the active isolation system.

Still other embodiments include a computerized device, configured to process all the method operations disclosed herein as embodiments of the invention. In such embodiments, the computerized device includes a memory system, a processor, communications interface in an interconnection mechanism connecting these components. The memory system is encoded with a process that provides remote passive detection of failed power lines and estimation of power line current and power flow as explained herein that when performed (e.g. when executing) on the processor, operates as explained herein within the computerized device to perform all of the method embodiments and operations explained herein as embodiments of the invention. Thus any computerized device that performs or is programmed to perform up processing explained herein is an embodiment of the invention.

Other arrangements of embodiments of the invention that are disclosed herein include software programs to perform the method embodiment steps and operations summarized above and disclosed in detail below. More particularly, a computer program product is one embodiment that has a computer-readable medium including computer program logic encoded thereon that when performed in a computerized device provides associated operations providing remote passive detection of failed power lines and estimation of power line current and power flow as explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other a medium such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. The system of the invention can be distributed between many software processes on several data communications devices, or all processes could run on a small set of dedicated computers, or on one computer alone.

It is to be understood that the embodiments of the invention can be embodied strictly as a software program, as software and hardware, or as hardware and/or circuitry alone, such as within a data communications device.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the presently disclosed power line sensor infer power line status (such as current flow in power line wires, location of power line wires, power line wire sag, etc.) from low frequency magnetic field created by an injected current.

Figure 1:
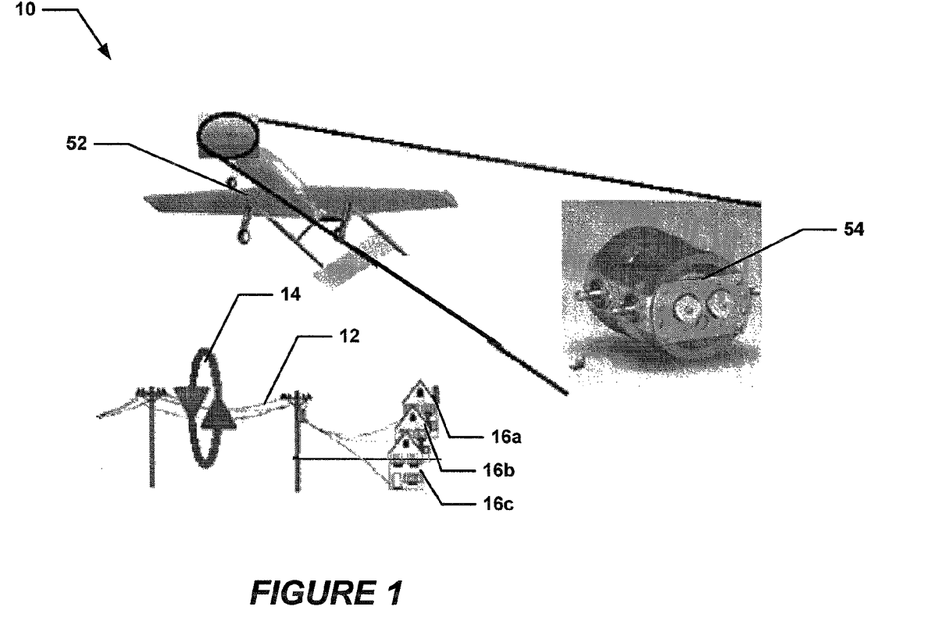
FIG. 1 depicts a diagram of power lines in a residential neighborhood and a power line sensor shown as part of an aircraft; in accordance with embodiments of the invention.

Referring now to FIG. 1, an environment 10 is shown wherein remote passive detection of failed power lines and estimation of power line current and power flow may be beneficial. A plurality of power lines 12 is shown connecting to a variety of residences 16a, 16b and 16c. A magnetic field 14 is present around the power lines 12, the magnetic field 14 generated by the signals flowing through power lines 12.

Low flying aircraft 52 can detect a magnetic field 14, which is equipped with a power line sensor 54. The power line sensor is a vibrationally isolated vector magnetic sensor. The power line sensor includes a passive vibration isolation system, as well as active isolation including motion sensors (e.g., accelerometers) and signal processing methodologies for active reduction (cancellation) of sensor noise induced by sensor motion.

As stated above, the term "active isolation" as used herein refers to the use of accelerometers and/or current sensors (for EMI noise sources) to subtract from the sensor 'signals' that portion which is correlated with the accelerometers and/or current sensors. This is distinctly different from physically reducing the forces transmitted to the magnetometers due to platform motion. What we are describing here is more generally known as 'in-wire cancellation' rather than traditional active isolation which implies the use of secondary excitation sources (e.g., shakers) to physically minimize the force transmitted to the sensor (and therefore is motion due to platform noise sources).

The power line sensor system utilizes signal processing algorithms to infer power line status (e.g., current flow in individual wire) from measured magnetic field, sensor location, and ground truth information about power line location and geometry. Ground truth is a term used in cartography, meteorology, analysis of aerial photographs, satellite imagery and a range of other remote sensing techniques in which data are gathered at a distance. Ground truth refers to information that is collected "on location". In remote sensing, this is especially important in order to relate image data to real features and materials on the ground. The collection of ground-truth data aids in the interpretation and analysis of what is being sensed.

The power line sensing may also include the utilization of signal processing algorithms to display georegistered information about power lines on an operator display. In a particular embodiment the power line sensor is supplemented with one or more vector electric field sensors and signal processing methodologies to infer power line voltage and provide further power line characterization, such as direct measurement of power flow in one or more conductors.

A three-axial vector magnetic sensor is used to collect complete information about observed magnetic field. Point measurement of magnetic field, measurement point location, and a model of the power line (derived from the ground truth power line geometry) are used to infer power line status. Depending on the application needs, inferred power line status may include all or a subset of the following: estimated currents in individual wires, estimated wire locations, estimated wire sag, determination of the wire status as required by the application (e.g., wire is good, wire is open, wire is short, wire is on the ground, etc.).

Georegistered power line status can be displayed over a topographic map image, either in near real time (if operator is on-board), or off-line in post-processing (e.g., if operator is remote). Automated processing can be used to provide alerts to the on-board or remote operator (such as "failed wire" alert once a failed wire is found). Multiple layers of power line status information can be made available to an operator.

The vector magnetic sensor is vibrationally isolated. Previous work with airborne magnetic sensors (such as that for geophysical exploration, or ASW) relied on DC scalar magnetic sensor (essentially, low frequency total field sensor). Only low frequencies were of interest, and total field magnetometer was used due to its lesser noise in response to the sensor motion. Embodiments of the presently disclosed remote passive detection of failed power lines and estimation of power line current and power flow include AC (high frequency) magnetic sensor, and extensively uses passive and active vibration isolation techniques to reduce sensor motion and provide a more accurate determination of power line status.

Power line status is not directly measured by stand-off sensor and thus is inferred from the stand-off measurements. Different signal processing techniques are used for this purpose. The power line sensor system may utilize estimation techniques. Currents in individual wires (three phase and neutral wires) are estimated using all collected observations points (or a subset of collected points) to obtain an estimate of power line status (current flow in individual wires). Less points can be used to reduce the time required to obtain the power line status, more points can be used to obtain a better quality estimate, and a combination of coherent averaging (global estimate) and incoherent averaging (averaging results obtained by estimation on separate data subsets) can be used.

The power line sensor system may use hypothesis testing techniques. A model of a magnetic field for a fixed power line state is compared with observations to assess a likelihood of this state (e.g., a model of magnetic field for a power line with phase A failed can be compared to the observed magnetic field to determine if this failure is observed).

The power line sensor system may use perturbation techniques. Once a solution is found, power line parameters known from ground truth information are perturbed slightly and a solution is calculated again, to assess robustness of the solution to potential errors and imperfections of ground truth information.

The power line sensor system may use matched filtering in order to isolate a desired signal from injected current from undesired signals from other currents and noise The power line sensor system further may use rules to assign power line "pass" or "fail" status, or generate other high level situation awareness information and/or alerts. The power line sensor may provide information to the user in the form of "alerts" or as a georegistered map layered over a topographic area map. Alerts are short messages summarizing results of automated processing, such as "dead power line detected". These messages are triggered when a predetermined result obtained by signal processing is met. Alert conditions may be changed or set by the operator.

The power line sensor system incorporates full three axial vector sensing for best possible characterization of local magnetic field and thus improved characterization of location and currents in the power line. The power line sensing system utilizes passive vibration isolation of vector sensor to reduce sensor noise, stiff sensor package design to reduce degrees of freedom of sensor motion to six, and an active vibration isolation applied to vector magnetic sensor. This consists of full six degree of freedom motion sensing, and signal processing algorithms to compute transfer function between motion and sensor output and remove noise generated by sensor motion from sensor output. Six degrees of freedom (6DoF) refers to motion in three dimensional space, namely the ability to move forward/backward, up/down, left/right (translation in three perpendicular axes) combined with rotation about three perpendicular axes (yaw, pitch, roll). As the movement along each of the three axes is independent of each other and independent of the rotation about any of these axes, the motion indeed has six degrees of freedom.

In a particular embodiment, the power line sensor system may further include a current injector which injects modulated current into the power line. This injection source is similar to sources used in Power Line Communications (PLC). This injection source is used to inject an identifiable current into the power line conductor. Modulation is used to make this current identifiable so a signature of this current can be identified in the presence of signatures from other currents. Arbitrary modulation technique can be used, including amplitude, frequency or phase modulation. Using modulated current may enable additional capability to provide communications along the power line wire. However if this capability is not required, simpler arbitrary identifiable unmodulated signals can be used (such as known frequency tone or other waveform, or a pulse train) to provide simpler, smaller, cheaper source than that used for PLC. Depending on site requirements, this current can be coupled into power line using direct coupling (e.g., through a capacitor) or inductively.

Figure 2:
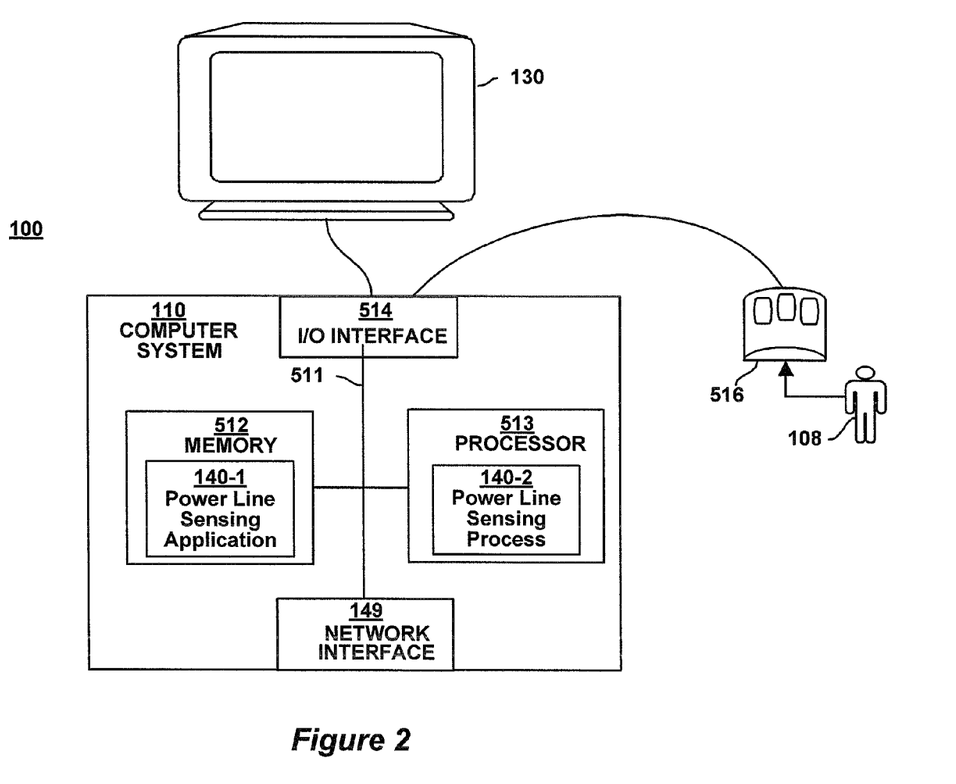
FIG. 2 illustrates an example computer system architecture for a computer system that performs remote passive detection of failed power lines and estimation of power line current and power flow in accordance with embodiments of the invention.

FIG. 2 illustrates example architectures of a computer system that is configured as a host computer system 240. The computer system 240 may be any type of computerized system such as a personal computer, workstation, portable computing device, mainframe, server or the like. In this example, the system includes an interconnection mechanism 211 that couples a memory system 212, a processor 213, and a communications interface 214. The communications interface 214 allows the computer system 240 to communicate with external devices or systems.

The memory system 212 may be any type of computer readable medium that is encoded with an application 255-A that represents software code such as data and/or logic instructions (e.g., stored in the memory or on another computer readable medium such as a disk) that embody the processing functionality of embodiments of the invention for the agent 255 as explained above. The processor 213 can access the memory system 212 via the interconnection mechanism 211 in order to launch, run, execute, interpret or otherwise perform the logic instructions of the applications 255-A for the host in order to produce a corresponding agent process 255-B. In other words, the agent process 255-B represents one or more portions of the agent application 255-A performing within or upon the processor 213 in the computer system. It is to be understood that the agent 255 operate as explained in former examples are represented in FIG. 5 by the agent application 255-A and/or the process 255-B.

It is to be understood that embodiments of the invention include the applications (i.e., the un-executed or non-performing logic instructions and/or data) encoded within a computer readable medium such as a floppy disk, hard disk or in an optical medium, or in a memory type system such as in firmware, read only memory (ROM), or, as in this example, as executable code within the memory system 212 (e.g., within random access memory or RAM). It is also to be understood that other embodiments of the invention can provide the applications operating within the processor 213 as the processes. While not shown in this example, those skilled in the art will understand that the computer system may include other processes and/or software and hardware components, such as an operating system, which have been left out of this illustration for ease of description of the invention. With the system of FIG. 2, a topographical map can be displayed and the power line status can be displayed over the topographical map. The system can also be used to provide alerts to an operator regarding the status of power lines.

Figure 3:
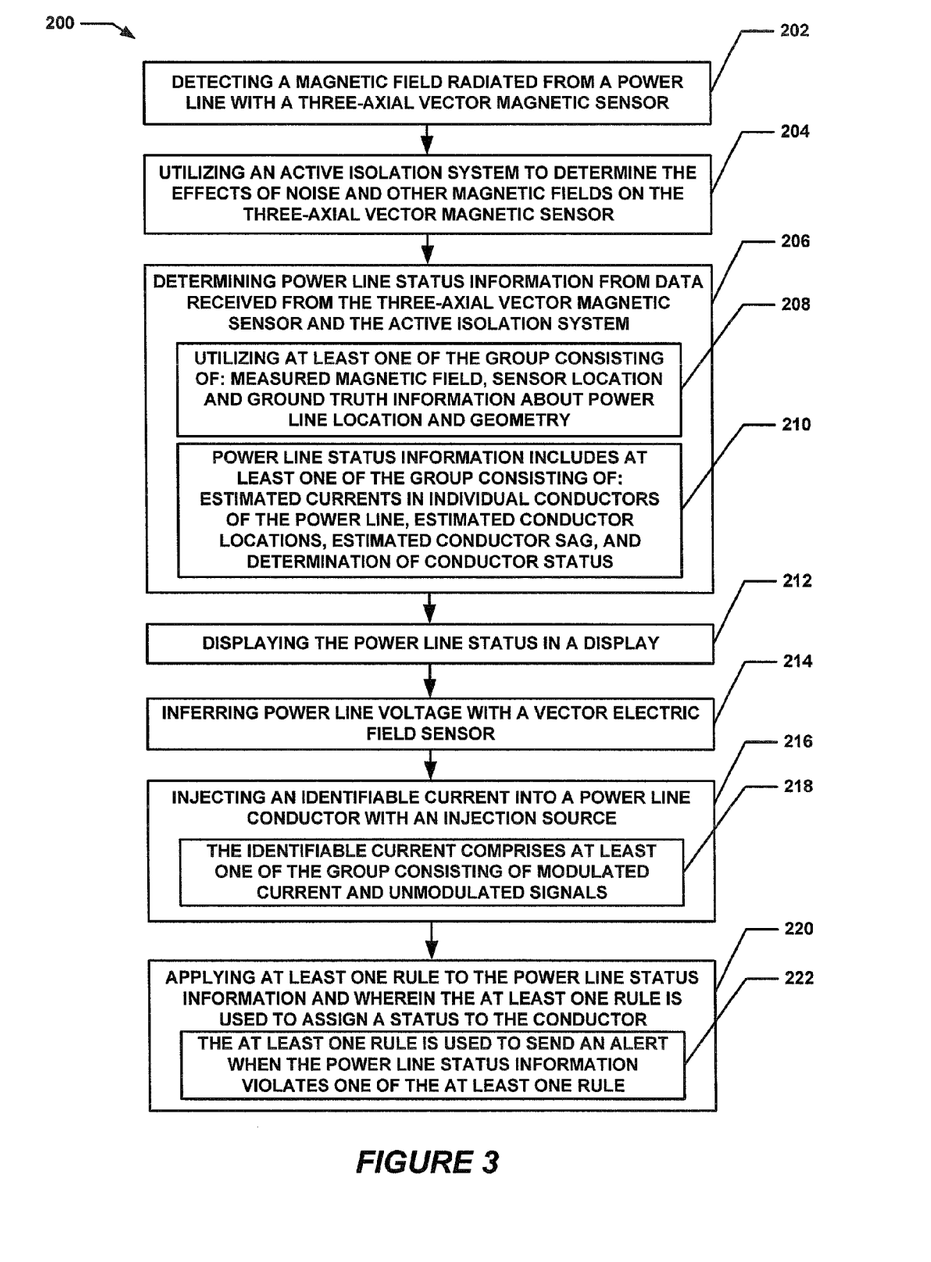
FIG. 3 depicts a flow diagram of a particular embodiment of a method of sensing a magnetic field generated from a power line in accordance with embodiments of the invention.
Figure 4:
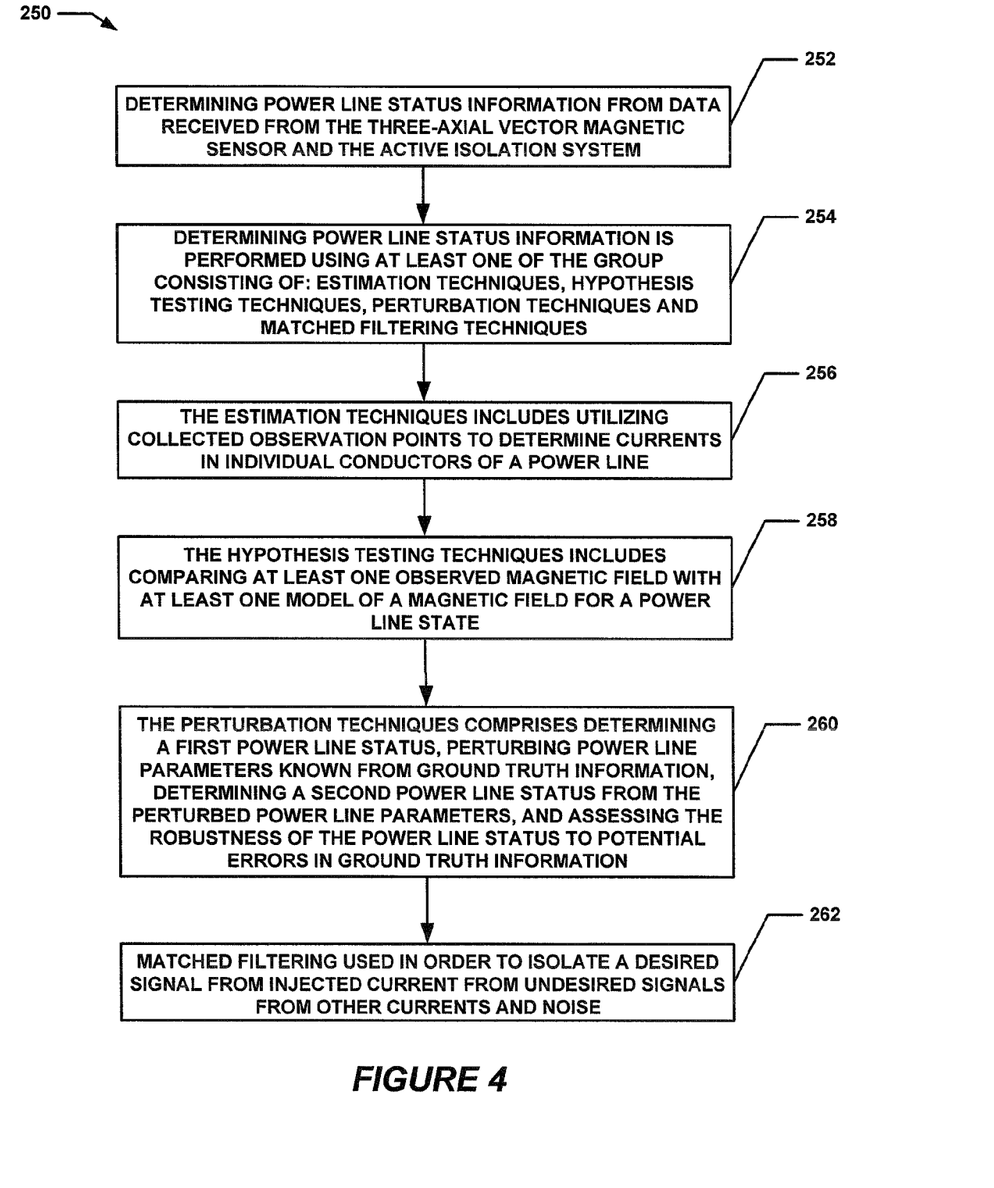
FIG. 4 depicts a flow diagram of a particular embodiment of a method of determining power line status in accordance with embodiments of the invention.

Flow charts of the presently disclosed methods are depicted in FIGS. 3 and 4. The rectangular elements are herein denoted "processing blocks" and represent computer software instructions or groups of instructions. Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 3, a particular embodiment of a method 200 of power line sensing is shown. The method 200 begins with processing block 202 which recites detecting a magnetic field radiated from a power line with a three-axial vector magnetic sensor. The sensor is suitable to deploy on any airborne platform (including unmanned aircraft); suitable to perform automated measurement, reporting and alerting; and capable to determine power status of conductors not visible optically, including power lines under foliage, underground and underwater (such as underground and underwater power cables).

Processing block 204 discloses utilizing an active isolation system to determine the effects of noise and other magnetic fields on the three-axial vector magnetic sensor. The active isolation includes motion sensors (e.g., accelerometers) and signal processing methodologies for active reduction (cancellation) of sensor noise induced by sensor motion.

Processing block 206 states determining power line status information from data received from the three-axial vector magnetic sensor and the active isolation system. This may include, as shown in processing block 208, using measured magnetic field, sensor location and ground truth information about power line location and geometry. This may further include using estimated currents in individual conductors of the power line, estimated conductor locations, estimated conductor sag, and determination of conductor status as shown in processing block 210.

Processing block 212 recites displaying the power line status in a display. A topographical map can be displayed and the power line status can be displayed over the topographical map.

Processing block 214 discloses inferring power line voltage with a vector electric field sensor. The power line sensor can supplemented with one or more vector electric field sensors and signal processing methodologies to infer power line voltage and provide further power line characterization, such as direct measurement of power flow in one or more conductors.

Processing continues with processing block 216 which states injecting an identifiable current into a power line conductor with an injection source. Processing block 218 recites the identifiable current comprises at least one of the group consisting of modulated current and unmodulated signals.

Processing block 220 discloses applying at least one rule to the power line status information and wherein the at least one rule is used to assign a status to the conductor. As shown in processing block 222, the at least one rule is used to send an alert when the power line status information violates one of the at least one rule. Alerts are short messages summarizing results of automated processing, such as "dead power line detected". These messages are triggered when a predetermined result obtained by signal processing is met. Alert conditions may be changed or set by the operator.

Referring now to FIG. 4, a particular embodiment of a method 250 of determining power line status is shown. Processing begins with processing block 252 which recites states determining power line status information from data received from the three-axial vector magnetic sensor and the active isolation system.

Processing block 254 discloses determining power line status information is performed using at least one of the group consisting of: estimation techniques, hypothesis testing techniques, perturbation techniques and matched filtering.

Processing block 256 states the estimation techniques include utilizing collected observation points to determine currents in individual conductors of a power line. Currents in individual wires (three phase and neutral wires) are estimated using all collected observations points (or a subset of collected points) to obtain an estimate of power line status (current flow in individual wires). Less points can be used to reduce the time required to obtain the power line status, more points can be used to obtain a better quality estimate, and a combination of coherent averaging (global estimate) and incoherent averaging (averaging results obtained by estimation on separate data subsets) can be used.

Processing block 258 discloses wherein the hypothesis testing techniques include comparing at least one observed magnetic field with at least one model of a magnetic field for a power line state. A model of a magnetic field for a fixed power line state is compared with observations to assess a likelihood of this state (e.g., a model of magnetic field for a power line with phase A failed can be compared to the observed magnetic field to determine if this failure is observed).

Processing block 260 states wherein the perturbation techniques comprises determining a first power line status, perturbing power line parameters known from ground truth information, determining a second power line status from the perturbed power line parameters, and assessing the robustness of the power line status to potential errors in ground truth information.

Processing block 262 recites using a matched filtering technique. The power line sensor system may use matched filtering in order to isolate a desired signal from injected current from undesired signals from other currents and noise.

Having described preferred embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals. Accordingly, it is submitted that that the invention should not be limited to the described embodiments but rather should be limited only by the spirit and scope of the appended claims.

What is claimed is:

1. A power line sensor comprising:
   a three-axial vector magnetic sensor to detect a magnetic field radiated from a power line;
   a passive vibration isolation system coupled to said vector magnetic sensor;
   an active isolation system; and
   a processor coupled to said three-axial vector magnetic sensor and said active isolation system, said processor configured to determine power line status information from data received from said three-axial vector magnetic sensor and said active isolation system.

2. The power line sensor of claim 1 wherein said processor is configured to determine power line status information from at least one of the group consisting of: the detected magnetic field, sensor location and ground truth information about power line location and geometry.

3. The power line sensor of claim 2 wherein said power line status information includes at least one of the group consisting of: estimated currents in individual conductors of said power line, estimated conductor locations, estimated conductor sag, and determination of conductor status.

4. The power line sensor of claim 1 wherein said determining power line status information is performed using at least one of the group consisting of: estimation techniques, hypothesis testing techniques, perturbation techniques and matched filtering.

5. The power line sensor of claim 4 wherein said estimation techniques includes said processor utilizing collected observation points to determine currents in individual conductors of a power line; wherein said hypothesis testing techniques includes said processor comparing at least one observed magnetic field with at least one model of a magnetic field for a power line state; wherein said perturbation techniques comprises said processor determining a first power line status, said processor perturbing power line parameters known from ground truth information, said processor determining a second power line status from the perturbed power line parameters, and said processor assessing robustness of the power line status to potential errors in ground truth information; and wherein matched filtering is utilized in order to isolate a desired signal from an injected current from undesired signals from other currents and noise estimations.

6. The power line sensor of claim 1 further comprising an injection source configured to inject an identifiable current into the power line, the identifiable current injected into the power line producing the magnetic field detected by the three-axial vector magnetic sensor.

7. The power line sensor of claim 6 wherein said identifiable current comprises at least one of the group consisting of modulated current and unmodulated signals.

8. The power line sensor of claim 1, wherein said processor is configured to apply at least one rule to said power line status information and wherein said at least one rule is used to assign a status to a conductor in the power line.

9. The power line sensor of claim 8 wherein said processor uses said at least one rule to send an alert when said power line status information violates one of said at least one rule.

10. The power line sensor of claim 1, wherein the magnetic field is generated based on current injected into the power line to test the power line, the current injected in the power line having a unique signature with respect to other currents present in the power line, the power line sensor further comprising:
   a display in communication with said processor and wherein said power line status is provided to said display, wherein the processor determines the power line status based on the current injected in the power line having the unique signature.

11. The power line sensor of claim 1 further comprising a vector electric field sensor coupled to said processor and wherein said vector electric field sensor infers power line voltage.

12. The power line sensor of claim 1 wherein said sensor has six degrees of freedom for sensor motion.

13. The power line sensor of claim 1 wherein said active isolation system includes at least one accelerometer to measure movement of a sensing coil of said sensor due to noise and at least one current probe to measure existence of other magnetic fields and wherein effects measured by said at least one accelerometer and said at least one current probe are subtracted from the magnetic field measured by said three-axial vector magnetic sensor.

14. The power line sensor of claim 1 wherein said sensor is configured to measure frequencies greater than sixty Hertz.

15. The power line sensor of claim 1, wherein said active isolation system includes at least one motion sensor to measure movement of a sensing coil of said three-axial vector magnetic sensor; and
   wherein effects on the three-axial vector magnetic sensor as measured by said at least one motion sensor are subtracted by the processor from a magnetic field detedted by said three-axial vector magnetic sensor to determine the power line status information.

16. The power line sensor of claim 1, wherein said active isolation system includes at least one current probe to measure magnetic fields other than those generated by the power line; and
   wherein effects on the three-axial vector magnetic sensor as measured by said at least one current probe are subtracted by the processor from a magnetic field detected by said three-axial vector magnetic sensor to determine the power line status information.

17. The power line sensor of claim 1, wherein said processor is configured to utilize collected observation points to determine currents in the power line; wherein said processor is configured to compare at least one observed magnetic field with at least one model of a magnetic field for a power line state; wherein said processor is configured to determine a first power line status, said processor configured to initiate perturbing power line parameters known from ground truth information, said processor further configured to determine a second power line status from the perturbed power line parameters, and said processor configured to assess robustness of the power line status information with respect to potential errors in ground truth information.

18. A method of power line sensing comprising:
    detecting a magnetic field radiated from a power line with a three-axial vector magnetic sensor;
    utilizing an active isolation system to determine effects of noise and other magnetic fields on said three-axial vector magnetic sensor; and
    producing power line status information from data received from said three-axial vector magnetic sensor and said active isolation system, the power line status information indicating a status of the power line.

19. The method of claim 18 wherein said producing power line status information includes utilizing at least one of the group consisting of measured magnetic field, sensor location and ground truth information about power line location and geometry.

20. The method of claim 19 wherein said power line status information includes at least one of the group consisting of: estimated currents in individual conductors of said power line, estimated conductor locations, estimated conductor sag, and determination of conductor status.

21. The method of claim 18 wherein said producing power line status information is performed using at least one of the group consisting of: estimation techniques, hypothesis testing techniques, perturbation techniques and matched filtering.

22. The method of claim 21 wherein said estimation techniques include utilizing collected observation points to determine currents in individual conductors of a power line; wherein said hypothesis testing techniques include comparing at least one observed magnetic field with at least one model of a magnetic field for a power line state; wherein said perturbation techniques comprises determining a first power line status, perturbing power line parameters known from ground truth information, determining a second power line status from the perturbed power line parameters, and assessing robustness of the power line status to potential errors in ground truth information; and wherein said matched filtering isolates a desired signal from injected current from undesired signals from other currents and noise estimations.

23. The method of claim 18 further comprising applying at least one rule to said power line status information and wherein said at least one rule is used to assign a status to said conductor.

24. The method of claim 23 wherein said at least one rule is used to send an alert when said power line status information violates one of said at least one rule.

25. The method of claim 18 further comprising displaying said power line status in a display.

26. The method of claim 18 further comprising inferring power line voltage with a vector electric field sensor.

27. The method of claim 18 further comprising injecting an identifiable current into a power line conductor with an injection source.

28. The method as in claim 18, wherein utilizing the active isolation system to determine effects on said three-axial vector magnetic sensor includes:
    utilizing a motion sensor to detect motion associated with the three-axial vector magnetic sensor; and
    wherein producing the power line status information includes adjusting a signal produced by the three-axial vector magnetic sensor based on the motion detected by the motion sensor to determine the power line status information.

29. A power line sensor comprising:
    a multi-axis magnetic sensor to detect presence of a magnetic field, the magnetic field radiated from the power line based on injection of a unique current into the power line;
    at least one motion sensor configured to detect motion associated with the multi-axis magnetic sensor; and
    a processor configured to produce power line status information based on data received from the at least one motion sensor and the multi-axis magnetic sensor, the power line status information indicating a health of the power line.

* * * * *